(12) United States Patent
Yoshimochi

(10) Patent No.: US 9,837,525 B2
(45) Date of Patent: *Dec. 5, 2017

(54) SEMICONDUCTOR DEVICE AND METHOD FOR MANUFACTURING SAME

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/937,835

(22) Filed: Nov. 10, 2015

(65) Prior Publication Data

US 2016/0064542 A1 Mar. 3, 2016

Related U.S. Application Data

(63) Continuation of application No. 11/887,102, filed as application No. PCT/JP2006/307565 on Apr. 10, 2006, now Pat. No. 9,202,891.

(30) Foreign Application Priority Data

Jun. 3, 2005 (JP) .................................. 2005-164301

(51) Int. Cl.
*H01L 21/70* (2006.01)
*H01L 29/78* (2006.01)
(Continued)

(52) U.S. Cl.
CPC ...... *H01L 29/7802* (2013.01); *H01L 29/0696* (2013.01); *H01L 29/0869* (2013.01);
(Continued)

(58) Field of Classification Search
CPC . H01L 29/1095; H01L 29/456; H01L 29/665; H01L 29/7802; H01L 29/0696;
(Continued)

(56) References Cited

U.S. PATENT DOCUMENTS 4,661,374 A 4/1987 Doering
4,677,452 A * 6/1987 Zommer ............. H01L 29/0696
257/341
(Continued)

FOREIGN PATENT DOCUMENTS

EP 0 393 949 A1 10/1990
JP S58-82574 A 5/1983
(Continued)

*Primary Examiner* — Meiya Li
(74) *Attorney, Agent, or Firm* — Rabin & Berdo, P.C.

(57) ABSTRACT

The semiconductor device includes a semiconductor substrate, a plurality of source regions formed in a stripe shape on the semiconductor substrate, a plurality of gate electrodes formed in a stripe shape between a plurality of the stripe shaped source regions on the semiconductor substrate, an insulating film for covering the source regions and the gate electrodes, the insulating film including a contact hole for partly exposing the source regions in a part of a predetermined region with respect to a longitudinal direction of the source regions; and a source electrode formed on the insulating film and electrically connected to the source region via the contact hole.

10 Claims, 4 Drawing Sheets

(51) Int. Cl.
  *H01L 29/06*     (2006.01)
  *H01L 29/10*     (2006.01)
  *H01L 29/423*    (2006.01)
  *H01L 29/45*     (2006.01)
  *H01L 29/66*     (2006.01)
  *H01L 29/08*     (2006.01)
  *H01L 29/417*    (2006.01)
  *H01L 29/49*     (2006.01)

(52) U.S. Cl.
  CPC .... *H01L 29/1095* (2013.01); *H01L 29/41741* (2013.01); *H01L 29/4238* (2013.01); *H01L 29/456* (2013.01); *H01L 29/665* (2013.01); *H01L 29/66712* (2013.01); *H01L 29/66719* (2013.01); *H01L 29/4933* (2013.01)

(58) Field of Classification Search
  CPC ........... H01L 29/0869; H01L 29/41741; H01L 29/4238; H01L 29/4933; H01L 29/66712; H01L 29/66719
  See application file for complete search history.

(56) References Cited

U.S. PATENT DOCUMENTS

| | | | |
|---|---|---|---|
| 4,998,151 A | 3/1991 | Korman et al. | |
| 5,182,222 A | 1/1993 | Malhi et al. | |
| 5,234,851 A | 8/1993 | Korman et al. | |
| 5,321,295 A | 6/1994 | Hisamoto et al. | |
| 5,703,389 A | 12/1997 | Knoch et al. | |
| 5,844,277 A | 12/1998 | Hshieh et al. | |
| 6,218,712 B1 | 4/2001 | Shimizu et al. | |
| 6,346,727 B1 | 2/2002 | Ohtomo et al. | |
| 9,202,891 B2 * | 12/2015 | Yoshimochi | H01L 29/0696 |
| 2004/0007766 A1 | 1/2004 | Nakayama et al. | |
| 2004/0251516 A1 | 12/2004 | Aida et al. | |
| 2005/0258503 A1 | 11/2005 | Nakayama et al. | |
| 2006/0049459 A1 | 3/2006 | Aida et al. | |
| 2009/0075433 A1 | 3/2009 | Aida et al. | |

FOREIGN PATENT DOCUMENTS

| | | |
|---|---|---|
| JP | 63-244777 A | 10/1988 |
| JP | 1-207976 | 8/1989 |
| JP | 2-290077 | 11/1990 |
| JP | 5-235361 | 9/1993 |
| JP | 8-321605 | 12/1996 |
| JP | 9-055506 | 2/1997 |
| JP | 11-204781 | 7/1999 |
| JP | 2000-196072 | 7/2000 |
| JP | 2004-96067 | 3/2004 |
| JP | 2004-179277 A | 6/2004 |
| JP | 2004-273645 | 9/2004 |
| JP | 2005-5438 | 1/2005 |
| JP | 2005-064283 A | 3/2005 |

* cited by examiner

SEMICONDUCTOR DEVICE AND METHOD FOR MANUFACTURING SAME

CROSS-REFERENCE TO RELATED APPLICATIONS

This application is a continuation of U.S. application Ser. No. 11/887,102, which was filed on Sep. 25, 2007, and was allowed on Jul. 27, 2015, and which was a U.S. National Stage application of International Application No. PCT/JP2006/307565, which was filed on Apr. 10, 2006. These applications claimed priority to Japanese Patent Application No. 2005-164301 filed with the Japanese Patent Office on Jun. 3, 2005. The disclosures of these prior applications are incorporated herein by reference.

TECHNICAL FIELD

The present invention relates to a semiconductor device which comprises a plurality of source regions formed in a stripe shape on a semiconductor substrate, and a plurality of gate electrodes formed in a stripe shape on the semiconductor substrate between the stripe-shaped source regions, and to a method of manufacturing the same.

BACKGROUND ART

The power MOSFET (Metal Oxide Semiconductor Field Effect Transistor) and the IGBT (Insulated Gate Bipolar Transistor) as a discrete element used for switching power supply and the like are required to have high speed operating characteristics and low on-resistance properties. High speed operating characteristics are achieved by a planar structure having low capacitance characteristics.

For example, the MOSFET having a planar structure disclosed in Patent Document 1, as shown in FIG. 5, comprises a plurality of gate electrodes 2 formed in a stripe shape on an N type semiconductor board 1, P⁻ type base layers 3 and N⁺ type source layers 4 formed in a self-aligned manner by double diffusion with respect to the gate electrodes 2, an interlayer insulating film 5 to cover the gate electrode 2, and a source electrode (not shown) formed of metal film and formed on the interlayer insulating film 5. A plurality of P⁻ type base layers 3 and a plurality of N⁺ type source layers 4 are formed in a stripe shape along the gate electrodes 2. On the N+ type source layer 4, the interlayer insulating film 5 is formed with stripe shaped contact holes 7 along the entire length in a longitudinal direction of the source layer 4. The source electrode enters through the contact hole 7 to form an ohmic junction with the source layer 4.

With such structure, after the common connection of the plurality of gate electrodes 2 is made and the gate electrodes 2 are applied with a voltage larger than the predetermined threshold voltage, a surface portion of the base layer 3 is formed with an inversion layer and electricity is conducted between the semiconductor substrate 1 (drain) and the source layer 4, thus achieving transistor operation.
Patent Document 1: Japanese Unexamined Patent Publication No 8-321602

DISCLOSURE OF THE INVENTION

Problems to be Solved

With the structure mentioned above, however, the contacts hole 7 must depend their formation upon lithography, and so that the spacing between the adjacent gate electrodes 2 are subjected to the limitation due to the minimum size of the contact hole 7 and the mask alignment tolerance (margin) for the formation of the gate electrode 2 and the contact hole 7.

On this account, the structure limits the refining of the pattern by reducing the spacing between the gate electrodes 2 and hampers an attempt for the improvement in the gate width (the total extension of the portion opposing to the source layer 4 in the gate electrode 2) per unit area, which limits the reduction in the on-resistance.

On the other hand, when the width of the gate electrode 2 is reduced, the number of the gate electrodes 2 per unit area can be increased, and the gate width can also be increased. However, it may cause a problem that the resistance of the gate electrode 2 (gate-resistance) is increased and the high speed operation is hampered.

It is, therefore, an object of the present invention to provide a semiconductor device that is capable of reducing the on-resistance without sacrificing the operation speed, and a method of manufacturing the same.

Means for Solving the Problem

The semiconductor device according to the present invention comprises a semiconductor substrate; a plurality of source regions formed in a stripe shape on the semiconductor substrate; a plurality of gate electrodes formed in a stripe shape between the plurality of stripe shaped source regions on the semiconductor substrate; an insulating film for covering the source regions and the gate electrodes, the insulating film including a contact hole for partly exposing the source region in a part of a predetermined region with respect to a longitudinal direction of the source regions; and a source electrode formed on the insulating film and electrically connected to the source region via the contact hole.

According to this structure, the contact hole for connecting the source region and the source electrode is not formed over the entire length of the stripe shaped source region, but formed to only partly expose the source region in a part of a predetermined region with respect to a longitudinal direction of the source region. Therefore, the region other than the vicinity of the contact hole is able to reduce the spacing between the gate electrodes without being subjected to the limitation due to the minimum size of the contact hole and the mask alignment tolerance for the formation of the contact hole, and the width of the gate electrode need not be narrowed. Thus, the pattern can be refined and the gate width per unit area can be increased without leading to the increase in the gate-resistance, thereby reducing the on-resistance without sacrificing the operation speed.

The source region is formed in a stripe shape on the semiconductor substrate and each of the components are electrically connected with each other. Therefore, when the components are arranged to be partly contacted with the source electrode, the entire thereof is electrically connected to the source electrode.

It is preferable that the source region is processed to have a low resistance by applying silicide or the like on the surface thereof as appropriate. This can further reduce the on-resistance.

It is further preferable that the contact holes are disposed at a longitudinal end of the source region. With this structure, the contact hole contacts with the source electrode at the end portion of the source region thereby to effectively utilize the central region of the semiconductor substrate.

It is furthermore preferable that the contact holes are disposed only at a longitudinal end of the source region, so that the stripe shaped gate electrode can have a narrower spacing with the adjacent gate electrode and each of the adjacent gate electrodes can have a greater width therebetween along a longer region.

As an alternative structure, the contact hole may be disposed only at a predetermined position (the central portion, for example) in the middle of a longitudinal direction of the source region.

It is preferable that a plurality of contact holes are disposed in spaced relation in the longitudinal direction of the source region. With this structure, the electrical connection between the source region and the source electrode can be further ensured. In addition, in a region between the contact holes, sufficient gate electrode width can be maintained and at the same time the spacing between the adjacent gate electrodes can be made narrower, thereby increasing the gate width without sacrificing the gate-resistance.

It is preferable that the gate electrode includes a narrow width portion disposed at the side of the contact hole and a wide width portion having a wider width than the narrow portion. With this structure, on the one hand, the gate electrode has a narrower width at the side of the contact hole so as to ensure a distance between the gates in consideration of the minimum size of the contact hole and the mask alignment tolerance for the formation of the contact hole, and on the other hand, the gate electrode has a greater width at the other portion (preferably, the entire region except the side of the contact hole) so as to ensure a width that can achieve sufficient on-resistance. As a result, the electrical connection between the source region and the source electrode can be ensured. In addition, the spacing between the adjacent gate electrodes can be reduced so as to achieve a finer structure without sacrificing the gate-resistance, thereby increasing the gate width.

It is preferable that the source region is formed in a self-aligned manner with respect to the gate electrode. With this structure where the gate electrode and the source region are formed in a self-aligned manner, the region except the vicinity of the contact hole can have extremely finer spacing between the gate electrodes.

A method of manufacturing a semiconductor device according to the present invention comprises the steps of forming a plurality of gate electrodes in a stripe shape on a semiconductor substrate; forming a plurality of source regions in a stripe shape using the gate electrodes as a mask on the semiconductor substrate; forming an insulating film for covering the source regions and the gate electrodes, the insulating film including a contact hole for partly exposing the source regions in a part of a predetermined region with respect to a longitudinal direction of the source regions; and forming a source electrode formed on the insulating film and electrically connected to the source region via the contact hole.

According to the aforementioned method, the semiconductor device having the structure as described above can be manufactured. It should be noted that other modifications can be applied to the present invention as similar to the other inventions relevant to semiconductor devices.

Aforementioned or further objectives, features and advantages of the present invention will be apparent from the following description of the preferred embodiments thereof in connection with the accompanying drawings.

DESCRIPTION OF THE REFERENCE SYMBOLS

11 . . . N type semiconductor substrate, 12 . . . gate electrode, 12A . . . silicide layer, 13 . . . P⁻ type base layer, 14 . . . N⁺ type source region, 14A . . . silicide layer, 15 . . . gate insulating film, 16 . . . side wall, 17 . . . interlayer insulating film, 18 . . . source electrode, 19 . . . p⁺ type layer, 20 . . . contact region, 21 . . . contact hole, 25 . . . Ti film, 121 . . . narrow width portion, 122 . . . wide width portion

BEST MODE FOR CARRYING OUT THE INVENTION

Figure 1:
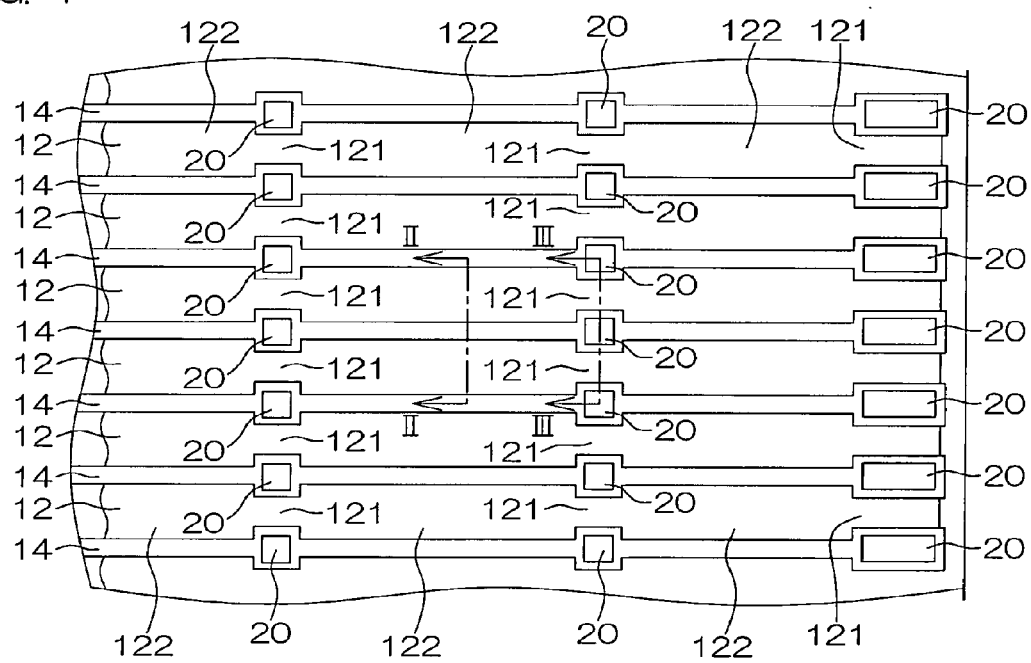
FIG. 1 is an illustrative plan view of an arrangement of gate electrodes and the like of a power MOSFET as a discrete semiconductor element according to an embodiment of the present invention.
Figure 2:
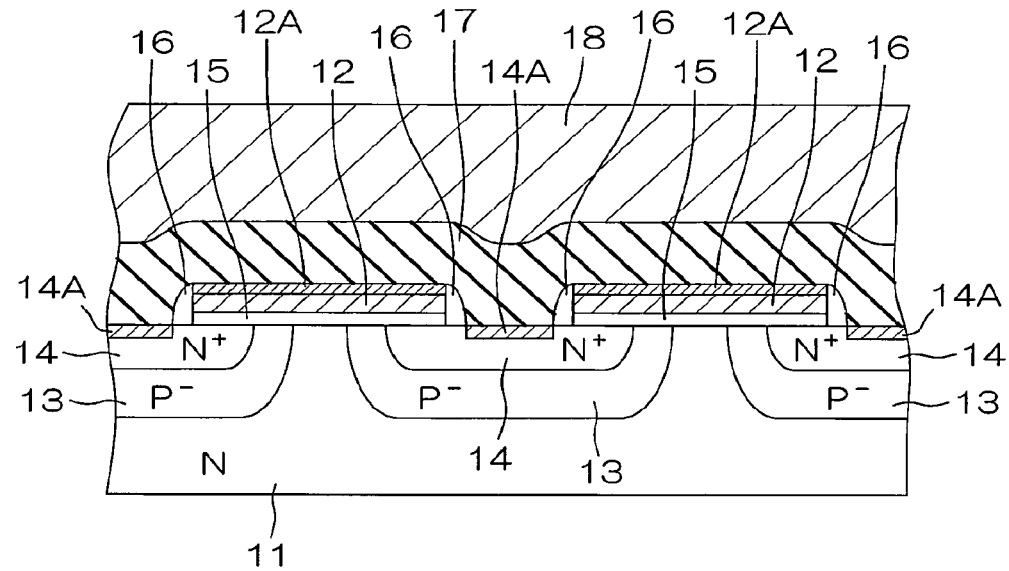
FIG. 2 is a cross-sectional view of a FIG. 1 taken along a line II-II.
Figure 3:
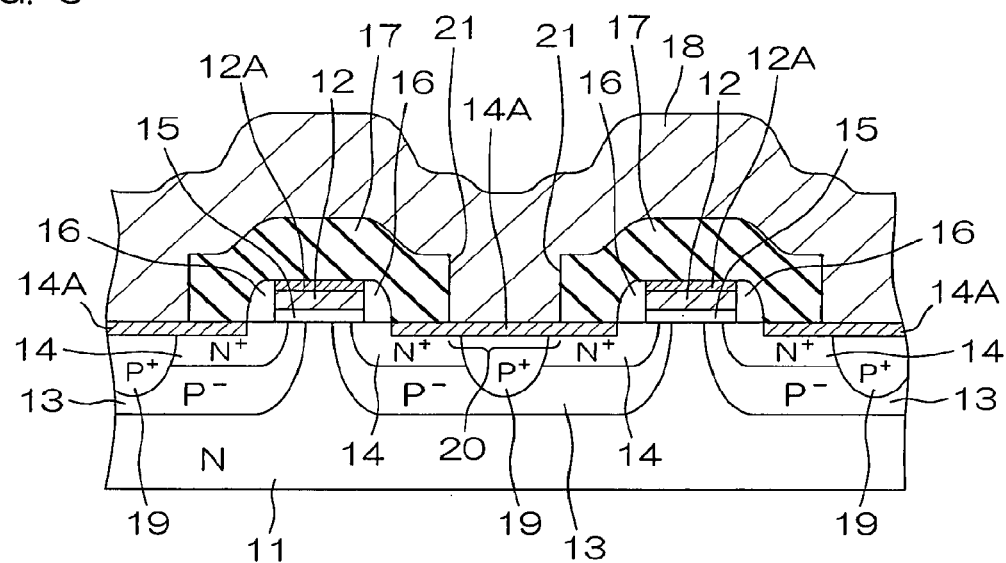
FIG. 3 is a cross-sectional view of a FIG. 1 taken along a line III-III.

FIG. 1 is an illustrative plan view of an arrangement of gate electrodes of a power MOSFET as a discrete semiconductor element according to an embodiment of the present invention, FIG. 2 is a cross-sectional view of FIG. 1 taken along a line II-II, and FIG. 3 is a cross-sectional view of a FIG. 1 taken along a line III-III.

The power MOSFET comprises a N type semiconductor substrate 11, a plurality of gate electrodes 12 formed to have a stripe pattern on the N type semiconductor substrate 11, a plurality of N⁺ type source region 14 formed to have a stripe pattern on the surface portion of the semiconductor substrate 11 between the plurality of gate electrodes 12, and a P⁻ type base layer 13 formed to surround the source region 14. The power MOSFET further comprises a gate insulating film 15 interposed between the semiconductor substrate 11 and the gate electrode 12, a side wall 16 formed of insulating films covering the both sides of the gate electrode 12, an interlayer insulating film 17 covering the gate electrode 12 and the like, and a source electrode 18 disposed on the interlayer insulating film 17.

The gate electrode 12 is formed of, for example, polysilicon film, and on the surface thereof silicide layer 12A is formed to reduce the resistance. Additionally, a silicide layer 14A is formed on the surface of the source region 14 to reduce the resistance of the entire source region 14.

The source region 14 is formed to extend across a pair of adjacent gate electrodes 12, and contacts with the interlayer insulating film 17 and the source electrode 18 between the pair of gate electrodes 12. More specifically, the elongated source region 14 has contact regions 20 disposed in spaced relation on the both ends and the intermediate portion thereof. The contact region 20 is a region defined by the contact holes 21 that are discretely arranged on the interlayer insulating film 17. That is, in the interlayer insulating film 17, the contact hole 21 is disposed on the end portions in a longitudinal direction of the source region 14, and further, a plurality of contact holes 21 are disposed in longitudinally spaced relation on the intermediate portion thereof. The contact hole 21, therefore, partly exposes the source region 14 in a part of a predetermined region (contact region 20) with respect to the longitudinal direction of the source region 14.

Through this contact hole 21, the source electrode 18 is joined to the source region 14. In the vicinity of the contact region 20, the width of the exposed region in the source region 14 (the width of the region that is not covered by a gate structure portion comprising of the gate electrode 12 and the side wall 16) is formed wider than other portions. In other words, the gate electrode 12 has a narrow width portion 121 in a region on the sides of the contact region 20 and has a wide width portion 122 in a region other than the sides of the contact region 20. As a matter of course, the wide width portion 122 has a wider width than the narrow width portion 121.

The contact region 20 in the source region 14 is provided with a $P^+$ type layer 19 connected to the $P^-$ type base layer 13. The $P^+$ type layer 19, which contacts with the source electrode 18, is conducive to the stability of the electric potential of the $P^-$ type base layer 13.

In the power MOSFET with the structure described above, common connection of the plurality of gate electrodes 12 and application of a control voltage that is higher than a predetermined threshold voltage can form an inversion layer (channel) in the surface portion of the $P^-$ type base layer 13 (directly below the gate electrode 12). Accordingly, electricity is conducted between the semiconductor substrate 11 and the source region 14 that serves as a drain region, allowing a drain current to flow from the semiconductor substrate 11 to the source region 14. The drain current flows through the source region 14 to the contact region 20, and finally to the source electrode 18 from the contact region 20.

The use of the source region 14 that is formed in a stripe shape as a drain current path permits excellent transistor operation even when the contact region 20 is discretely arranged with respect to the longitudinal direction of the source region 14.

In addition, the contact region 20 is partly formed so as to expose only a part thereof with respect to the longitudinal direction of the source region 14, so that the adjacent gate electrodes 12 can have smaller spacing therebetween without a need to consider formation of the contact hole 21 in a region except for the vicinity of the contact region 20 and each of the gate electrodes 12 can maintain a greater width. In other words, the spacing between the adjacent gate electrodes can be reduced without sacrificing the width of the gate electrode 12 and thus higher integration can be achieved. As a result, the gate width per unit area can be increased without sacrificing the gate-resistance and thus a power MOSFET can be achieved which can work at high speed with low on-resistance. In this embodiment, in particular, the formation of the $P^-$ type base layer 13 and the $N^+$ type source region 14 in a self-aligned manner with respect to the gate electrode 12 allows significantly fine patterning, thereby reducing the on-resistance per unit area to, for example, about a half of that observed in the conventional technology.

Further, smaller spacing between the adjacent gate electrodes 12 can restrain the increase of a parasitic capacitance formed by a junction between the $P^-$ type base layer 13 and the N type semiconductor substrate 11, which can be conducive to the high speed operation. Furthermore, the greater width between the gate electrodes 12 can provide relatively greater spacing between the adjacent $P^-$ type base layers 13 directly below the gate electrode 12, which can reduce the JFET resistance and can also be conducive to the reduction in the on-resistance.

Moreover, in this embodiment, the source region 14, which is provided with the silicide layer 14A in an attempt to reduce the resistance, serves as an excellent path for drain current in an attempt to further reduce the on-resistance.

In this manner, the two generally mutually contradictory ideas of very high speed operation and low on-resistance can be successfully achieved at the same time. This embodiment may be applied to, for example, a DC-DC converter and the like, so that the operation efficiency can be significantly improved.

Additionally, since the contact region 20 maintains a sufficient spacing between the adjacent gate electrodes 12, the individual contact hole 21 can have a sufficient size and can also be formed at any desired position through the application of photolithography process.

Figure 4D:
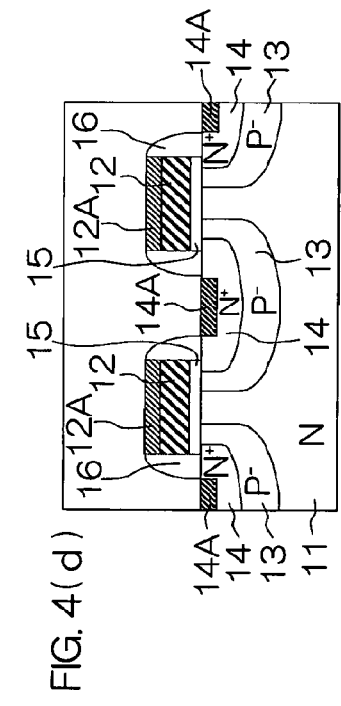
FIGS. 4(a) through 4(e) are illustrative cross-sectional views for describing a production process of the power MOSFET.
Figure 4E:
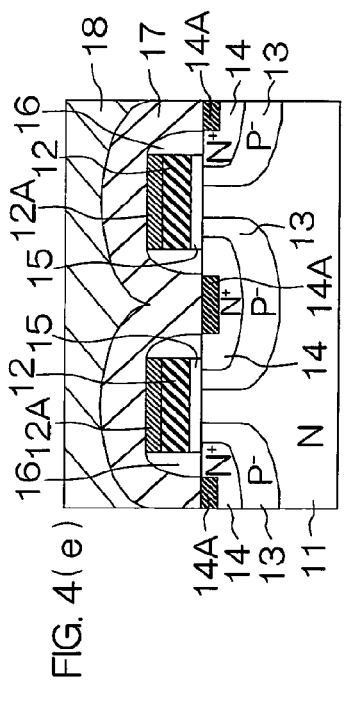
Figure 4A:
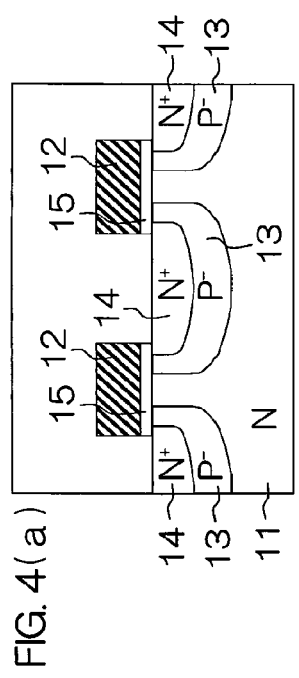

FIGS. 4(a) through 4(e) are illustrative cross-sectional views for describing a production process of the power MOSFET. As shown in FIG. 4(a), the gate insulating films (oxide layer) 15 and the gate electrodes 12 are first formed in a stripe pattern on the semiconductor substrate 11. As a matter of course, the pattern includes the narrow portion 121 that corresponds to the sides of the contact region 20 and the wide portion 122 that corresponds to a region except the sides of the contact region 20. The gate insulating film 15 is formed of, for example, a silicon oxide layer with a layer thickness of 100 to 1500 angstroms. The gate electrode 12 is formed of, for example, a polysilicon layer with a layer thickness of 1000 to 10000 angstroms. The wide portion 122 has a thickness of, for example, approximately 2.80 μm.

Subsequently, on the semiconductor substrate 11, P type impurities are introduced (channel diffusion) in a self-aligned manner using a gate electrode 12 as a mask, and N type impurities are introduced (source diffusion) in a self-aligned manner using a gate electrode 12 as a mask, and then heat treatment is performed. Thus, the P type impurities and the N type impurities are diffused within the semiconductor substrate 11 so that the $P^-$ type base layer 13 is discretely formed in a region between the gate electrodes 12, and the $N^+$ type source region 14 is formed in a region inside the $P^-$ type base layer 13 mainly in the region between the gate electrodes 12. Impurities are diffused, for example, from the surface of the semiconductor substrate 11 to the depth of 0.65 micrometers in the $P^-$ type base layer 13, and from the surface of the semiconductor substrate 11 to the depth of 0.35 micrometers in the $N^+$ type source region 14. The diffusion distance of the impurities is constant at any region on the semiconductor substrate 11. The $P^-$ type base layer 13 and the $N^+$ type source region 14, therefore, are formed in a stripe pattern in a self-aligned manner with respect to the plurality of gate electrodes 12 that are formed in a stripe pattern.

Figure 4B:
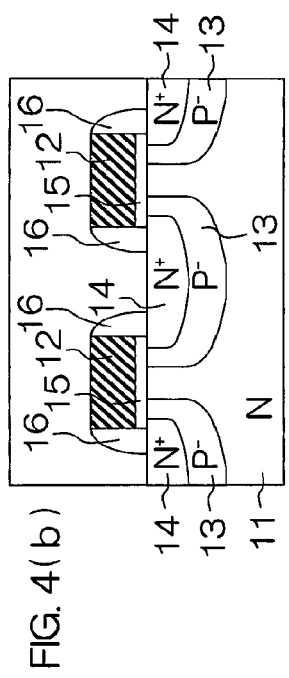

Then, as shown in FIG. 4(b), the side walls 16 are deposited on the sides of the gate electrodes 12. The side walls 16 may be obtained by forming an oxide layer (with a layer thickness of, for example, 2500 angstroms) on the entire surface thereof by a CVD (Chemical Vapor Deposition) method and then by performing anisotropic etching. The width of the side walls 16 in a direction along the surface of the semiconductor substrate 11 is, for example, about 0.20 micrometers.

Figure 4C:
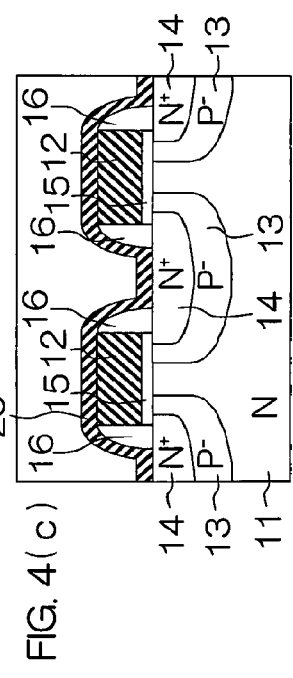
Figure 5:
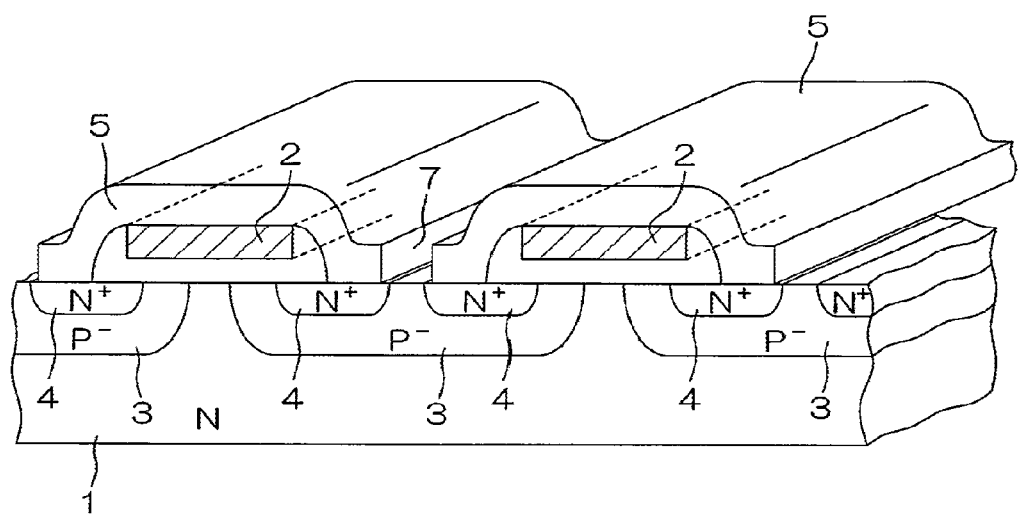
FIG. 5 is an illustrative cross-sectional view for describing a structure of a power MOSFET according to the conventional technology.

Then, as shown in FIG. 4(c), Ti layer 25 (with a layer thickness of, for example, 100 to 3000 angstroms) is formed on the entire surface of the semiconductor substrate 11 by a spattering. Under this state, when lamp annealing (RTA: Rapid Thermal Annealing) is performed for 30 seconds at 600-800° C., for example, the surface of the gate electrode 12 is silicided to form silicide layers 12A, which are composed of TiSi. At the same time, the region that contacts with the Ti layer 25 on the surface of the source region 14 is silicided to form silicide layers 14A which are also composed of TiSi. Then, the Ti layer 25 (the portion except for the silicide layers 12A, 14A) is removed by selective etching using $NH_4OH$ and $H_2O_2$, for example, and the second lamp annealing is performed (for 20 seconds at 700-1000° C., for example). Thus, the silicide layers 12A, 14A (with a layer thickness of, for example, approximately 0.15 micrometers) are completely silicided.

Thereafter as shown in FIG. 4(*e*), the interlayer insulating film 17 (formed of, for example, silicon oxide layer with a layer thickness of 1000 to 10000 angstroms) that covers the entire surface thereof is formed by a CVD method, for example. The contact holes 21 are then opened at the contact region 20 (see FIG. 1 and FIG. 3) by photolithography, and the source electrode 18 (formed of, for example, aluminum) is further formed on the interlayer insulating film 17, to provide the power MOSFET having the structure described above with reference to FIGS. 1 through 3.

Hereinabove, although one embodiment of the present invention has been described, it should be noted that this invention can be implemented in other embodiments. For example, although in the structure described in the above embodiment, the contact region 20 is provided at the end portions and the intermediate portion of the source region 14, the contact region 20 may be provided only at the end portions or only at the intermediate portion of the source region 14. Further, the individual source region 14 should not necessarily be provided with the plurality of contact regions 20, but may be provided with only the single contact region 20. Furthermore, although in the aforementioned embodiment, an example of the structure of the N channel type power MOSFET by using the N type semiconductor substrate 1 is described, a structure with the P channel type power MOSFET can also be obtained by inversing the conductivity type in each of the regions. Moreover, although in the aforementioned embodiment, the gate electrode 12 and the source region 14 are formed with the silicide layers 12A, 14A, these silicide layers should not necessarily be provided therewith. In addition, although in the aforementioned embodiment, the present invention is applied to the power MOSFET, the invention may be applied to other types of MOSFETs or elements other than MOSFET (IGBT and the like, for example).

While the illustrative embodiment of the present invention is provided in the above description, such is for illustrative purpose only to clarify the technology of the present invention and it is not to be construed restrictively. The spirit and scope of the present invention are to be limited only by the appended claims.

What is claimed is:

1. A semiconductor device, comprising:
    a semiconductor substrate;
    a plurality of source regions each arranged in a striped-shape on the semiconductor substrate;
    a plurality of gate electrodes each arranged in the striped-shape and between a first adjacent pair of the plurality of source regions on the semiconductor substrate;
    an insulating film configured to cover the plurality of source regions and the plurality of gate electrodes, the insulating film including a plurality of contact holes arranged in spaced relation and configured to partly expose the plurality of source regions in a part of a predetermined region with respect to a longitudinal direction of each of the plurality of source regions;
    at least one source electrode formed on the insulating film and electrically connected to at least one of the plurality of source regions via at least corresponding one of the plurality of contact holes; and
    a silicide layer formed on a surface of the at least one of the plurality of source regions,
    wherein a first contact hole included in the plurality of contact holes has a maximum width along a direction perpendicular to the longitudinal direction, the maximum width of the first contact hole being greater than a maximum width of an intermediate portion of the silicide layer between the first contact hole and a second contact hole adjacent to the first contact hole arranged in the longitudinal direction on a first source region included in the plurality of source regions.

2. The semiconductor device as set forth in claim 1, wherein the silicide layer includes a first region and a second region, the first region is in contact with the at least one source electrode via the at least corresponding one of the plurality of contact holes, the second region is covered with the insulating film.

3. The semiconductor device as set forth in claim 2, wherein the second region provides a conductive path between an adjacent pair of the plurality of contact holes that are arranged on a second source region included in the plurality of source regions.

4. The semiconductor device as set forth in claim 1, wherein a distance between an adjacent pair of the plurality of contact holes arranged in the longitudinal direction on a second source region included in the plurality of source regions is greater than a distance between a second adjacent pair of the plurality of source regions in the direction perpendicular to the longitudinal direction.

5. The semiconductor device as set forth in claim 1, wherein more than one of the plurality of contact holes respectively are arranged on a second adjacent pair of the plurality of source regions, and are arranged in the direction perpendicular to the longitudinal direction.

6. The semiconductor device as set forth in claim 1, wherein at least one of the plurality of contact holes other than the first contact hole and the second contact hole is arranged at a longitudinal end of a second source region included in the plurality of source regions.

7. The semiconductor device as set forth in claim 1, wherein at least three of the plurality of contact holes including the first contact hole and the second contact hole are arranged in spaced relation in the longitudinal direction on a second source region included in the plurality of source regions.

8. The semiconductor device as set forth in claim 1, wherein at least one of the plurality of gate electrodes includes a narrow width portion disposed at a side of each of the plurality of contact holes and a wide width portion disposed at a side of each of the plurality of source regions, the wide width portion having a width greater than a width of the narrow portion.

9. The semiconductor device as set forth in claim 1, wherein a second source region included in the plurality of source regions is formed in a self-aligned manner with respect to at least one of the plurality of gate electrodes.

10. The semiconductor device as set forth in claim 1, further comprising:
    a side wall formed on both sides of each of the plurality of gate electrodes.

* * * * *